(12) United States Patent
Han et al.

(10) Patent No.: US 8,574,794 B2
(45) Date of Patent: Nov. 5, 2013

(54) PHOTOSENSITIVE RESIN COMPOSITION

(75) Inventors: Jae Gook Han, Yongin-si (KR); Chung Seock Kang, Yongin-si (KR); Soo Kang Kim, Yongin-si (KR); Young Sung Suh, Seongnam-si (KR); Kyung Keun Yoon, Seongnam-si (KR)

(73) Assignee: Kolon Industries, Inc., Gwacheon-Si (KR)

( * ) Notice: Subject to any disclaimer, the term of this patent is extended or adjusted under 35 U.S.C. 154(b) by 239 days.

(21) Appl. No.: 12/948,344

(22) Filed: Nov. 17, 2010

(65) Prior Publication Data

US 2011/0117498 A1 May 19, 2011

(30) Foreign Application Priority Data

Nov. 18, 2009 (KR) .................. 10-2009-0111689
Nov. 18, 2009 (KR) .................. 10-2009-0111696

(51) Int. Cl.
*G02B 5/20* (2006.01)
*G03F 7/004* (2006.01)

(52) U.S. Cl.
USPC ....... 430/7; 430/270.1; 430/280.1; 430/287.1

(58) Field of Classification Search
None
See application file for complete search history.

(56) References Cited

FOREIGN PATENT DOCUMENTS

JP 2009-168949 A * 7/2009

OTHER PUBLICATIONS

Computer-generated translation of JP 2009-168949 (Jul. 2009).*

* cited by examiner

*Primary Examiner* — John A. McPherson
(74) *Attorney, Agent, or Firm* — Sughrue Mion, PLLC

(57) ABSTRACT

Disclosed herein is a photosensitive resin composition which exhibits proper optical density and hydrophobicity when it is formed into a light-shielding film, and which is useful in preventing the color mixing or position deviation of color ink when the color ink is charged in a region defined by a light-shielding film.

16 Claims, No Drawings

PHOTOSENSITIVE RESIN COMPOSITION

BACKGROUND OF THE INVENTION

1. Technical Field

The present invention relates to a photosensitive resin composition suitable for forming a light shielding film for an image display device such as a liquid crystal display (hereinafter, referred to as "LCD").

2. Description of the Related Art

A liquid crystal display (LCD) displays an image using optical anisotropy and birefringence of liquid crystal molecules. When an electric field is applied to a liquid crystal display (LCD), the liquid crystal alignment changes, which causes the light transmission characteristics to change.

Generally, in a liquid crystal display (LCD), when two substrates, which are each provided with electrodes to form an electric field, are disposed such that the electrodes face each other, a liquid crystal material is charged between the two substrates and then a voltage is applied to the electrodes to form an electric field. In this case, liquid crystal molecules move under the influence of the electric field and their light transmission changes, thereby displaying an image.

For example, a widely-used thin film transistor liquid crystal display (TFT-LCD) includes: a lower substrate, called an array substrate, on which thin film transistors and pixel electrodes are arranged; an upper substrate, called a color filter substrate, which is made of glass or plastic and which includes a black matrix and which also includes red, green and blue colored layers formed on the upper substrate; an overcoat having a thickness of 1~3 um and formed on the three colored layers, the overcoat being made of polyimide, polyacrylate, polyurethane or the like and serving to protect a color filter and maintain surface flatness, and a transparent conductive layer made of indium tin oxide (ITO) and formed on the overcoat, a voltage for driving liquid crystals being applied to the transparent conductive layer; and liquid crystals charged between the lower substrate and the upper substrate. Here, each of the lower and upper substrates is provided on both sides thereof with a polarizing plate that polarizes visible light (natural light). In the thin film transistor liquid crystal display (TFT-LCD), a voltage is applied to a TFT gate including pixels by an external circuit to turn on the TFT such that zero-phase voltage can be input to liquid crystals. Then, zero-phase voltage is applied thereto to store image information in the liquid crystals, and then the TFT turns off to keep electric charges stored in a liquid crystal charger and an auxiliary charger, thus displaying an image for a predetermined amount of time. When voltage is applied to the liquid crystals, the alignment of the liquid crystals changes, at which time, when light penetrates these liquid crystals, the light is diffracted. This diffracted light penetrates the polarizing plate, thus obtaining desired images.

Recently, efforts to increase the aperture ratio, simplify a manufacturing process and decrease a manufacturing cost by forming a color filter on a lower substrate, that is, an array substrate, not an upper substrate, that is, a color filter substrate, have been made.

Even though considering such a structural change in the TFT-LCD, a color filter is generally formed by dyeing, spraying, electrodepositing, ink-jet printing or the like. In particular, a technology of forming a color filter by ink-jet printing is advantageous in that it can simplify processing and reduce costs. However, the color filters formed by ink-jet printing are problematic because they cannot be formed in a uniform manner in a glass substrate or a liquid crystal display cell. The reason for this is because the nozzles of an ink-jet printer head discharge different amounts of ink. When the amounts of ink discharged by the nozzles of an ink-jet printer head are different from each other, there is a problem in that the amount of ink charged in each pixel region changes, and thus the color filters can be recognized as mottles. Further, when a light-shielding pattern, that is, a space corresponding to a pixel region defined by a black matrix, is charged with color ink, the color ink can be swollen in the form of a dome by the repulsion between the light-shielding pattern and the color ink and the surface tension of the color ink. Owing to the color ink charged in the space in the form of a dome, the thickness of the color filter formed at the center of a pixel region is different from the thickness of the color filter formed at the edge of the pixel region, thus causing color aberration. Therefore, due to the poor uniformity of the color filter attributable to these factors, display quality finally deteriorates.

SUMMARY OF THE INVENTION

Accordingly, the present invention has been devised to solve the above-mentioned problems, and the present invention intends to provide a photosensitive resin composition which has appropriate hydrophobicity and which can be used as part of a composition to form a cured film that can exhibit the proper optical density.

In particular, the present invention intends to provide a photosensitive resin composition which can be usefully used to form a light-shielding film when a colored layer is formed by an ink-jet printing process.

An aspect of the present invention provides a photosensitive resin composition, comprising: an alkali-soluble acrylic binder resin; and a cardo-based binder resin, wherein, when a cured resin film is formed using the composition, the cured resin film has an optical density (OD) of 2.0 or more per unit thickness (2.0 µm), and wherein the alkali-soluble acrylic binder resin is a polymer of a composition including a monomer represented by $C(O)OCHCH_2(CF_2)_xCF_3$ (here, x is an integer of 1~12), and includes 5~50 wt % of fluorine.

In the photosensitive resin composition, the alkali-soluble acrylic binder resin may include an acid group-containing monomer and another monomer which can be copolymerized with the monomer.

Preferably, in terms of alkali resistance, the alkali-soluble acrylic binder resin may further include an epoxy group-containing monomer.

The photosensitive resin composition may further comprise a multifunctional monomer having an ethylenic unsaturated double bond, a photopolymerization initiator, and a solvent.

In the photosensitive resin composition, the alkali-soluble acrylic binder resin may be included in an amount of 1~50 wt % based on the total solid content of the composition.

The photosensitive resin composition may further comprise at least one black pigment selected from carbon black, titanium black, acetylene black, aniline black, perylene black, strontium titanate, chromium oxide, ceria.

The black pigment may be included in an amount of 5~60 wt % in a solid content.

The photosensitive resin composition may further comprise a colorant containing a pigment mixture including two or more kinds of pigments which are mixed with each other to exhibit a black color. Here, the pigment mixture may include essential red and blue pigments and one or more selected from yellow, green and violet pigments.

More concretely, the pigment mixture may include, based on the total weight of the solid content in the colorant, 10~50 wt % of red pigment, 10~50 wt % of blue pigment, 1~20 wt % of yellow pigment, and 1~20 wt % of green pigment.

Further, the pigment mixture may further include, based on the total weight of the solid content in the colorant, 1~20 wt % of violet pigment.

Further, the pigment mixture may further include black pigment. In this case, the black pigment may be included in an amount of 15 wt % or less based on the total weight of the solid content in the colorant.

In the photosensitive resin composition, the colorant may be included in an amount of 20~80 wt % based on the total weight of the composition.

In the photosensitive resin composition, the pigment mixture may be a pigment dispersed liquid in which each pigment is dispersed in a solvent. In this case, the pigment dispersed liquid may include an acrylic pigment dispersant. More concretely, the pigment dispersed liquid may include 3~20 wt % of an acrylic pigment dispersant based on the total weight thereof.

In the photosensitive resin composition, the pigment dispersed liquid may include a fluorine-containing acrylic binder resin.

In the photosensitive resin composition, the cardo-based binder resin may include fluorine.

The photosensitive resin composition may further comprise a fluorine-containing epoxy monomer.

The photosensitive resin composition may further comprise a fluorine-containing siloxane monomer.

In the photosensitive resin composition, when a cured resin film is formed using the composition, the cured resin film may have a fluorine content of 5~50 wt %.

Further, in the photosensitive resin composition, when a cured resin film is formed using the composition, the cured resin film may have a contact angle of 85° or more to water, and may have a contact angle of 35° or more to 2-ethoxyethanol. Preferably, the cured resin film may have a contact angle of 85°~110° to water, and may have a contact angle of 35°~50° to 2-ethoxyethanol.

Further, in the photosensitive resin composition, when a cured resin film is formed using the composition, the cured resin film may have a dielectric constant of 10 or more.

Another aspect of the present invention provides a color filter substrate, comprising a black matrix formed using the photosensitive resin composition by photolithography.

Still another aspect of the present invention provides a thin film transistor substrate, comprising a black matrix formed using the photosensitive resin composition by photolithography.

Still another aspect of the present invention provides an image display device, comprising the color filter substrate as an upper substrate.

Still another aspect of the present invention provides an image display device, comprising the thin film transistor substrate as a lower substrate.

DESCRIPTION OF THE PREFERRED EMBODIMENTS

In the method of forming a color filter using ink-jet printing, a light-shielding pattern is formed using a photosensitive resin composition having a light-shielding property by photolithography, and then color ink (red, green and blue) is injected into a region corresponding to each pixel defined by the light-shielding pattern to form colored layers.

When the colored layers are formed in this way, processing can be simplified and costs can be reduced compared to when they are directly formed by photolithography. Further, the color reproducibility of the colored layers can be improved depending on the amount of injected color ink, thus maintaining the thickness and composition of the colored layers constant. Further, the colored layers formed in this way can be easily used to realize microcircuit patterns, and can be applied to flexible displays. Furthermore, this method is an environment-friendly method because the consumption of photoresist, solvent and energy can be reduced.

However, this method of forming a color filter using ink-jet printing requires the accuracy of ink-jet printing and needs the materials associated with ink-jet printing.

The present invention has been devised to meet the above requirements, and the present invention provides a photosensitive resin composition which can be used to form a light-shielding pattern suitable for forming a colored layer using ink-jet printing.

From this point of view, the photosensitive resin composition according to an embodiment of the present invention comprises: an alkali-soluble acrylic binder resin; and a cardo-based binder resin, wherein, when a cured resin film is formed using the composition, the cured resin film has an optical density (OD) of 2.0 or more per unit thickness (2.0 μm), and wherein the alkali-soluble acrylic binder resin is a polymer of a composition including a monomer represented by $C(O)OCHCH_2(CF_2)_xCF_3$ (here, x is an integer of 1~12), and includes 5~50 wt % of fluorine.

When the optical density (OD) per unit thickness (2.0 μm) of the cured resin film obtained from the photosensitive resin composition is less than 2.0, it is difficult for the cured resin film to exhibit a proper light-shielding effect even though the cured resin film becomes somewhat thicker. In particular, in the case where the cured resin film functions as a light-shielding film, since the cured resin film cannot sufficiently exhibit a light-shielding effect, it cannot block the light penetrating pixel electrodes which yet are not transparent pixel electrodes.

Meanwhile, in the photosensitive resin composition, a copolymer prepared by copolymerizing a monomer containing an acid group with another monomer which can be copolymerized with the monomer may be used as the alkali-soluble acrylic binder resin.

When the above copolymer is used as the alkali-soluble acrylic binder resin, the strength of the cured resin film can be improved compared to when a homopolymer is used as the alkali-soluble acrylic binder resin. Further, a polymer compound prepared by polymerizing this copolymer with an ethylenic unsaturated compound containing an epoxy group may also be used as the alkali-soluble acrylic binder resin.

That is, the copolymer prepared by copolymerizing a monomer containing an acid group with a monomer which can be copolymerized with the monomer may be used as the alkali-soluble acrylic binder resin. Further, in addition to the copolymer, the polymer compound prepared by polymerizing this copolymer with an ethylenic unsaturated compound containing an epoxy group may be used together with this copolymer.

Examples of the monomer containing an acid group may include (meth)acrylic acid, crotonic acid, itaconic acid, maleic acid, fumaric acid, monomethyl maleic acid, isoprene sulfonic acid, styrene sulfonic acid, and 5-norbornene-2-carboxylic acid. These monomers may be used independently or in the form of a mixture of two or more monomers.

In particular, because the cured resin film should be highly alkali resistant, it is preferred that the alkali-soluble acrylic binder resin contains an epoxy group. For this reason, at the time of preparing the alkali-soluble acrylic binder resin, it is preferred that a monomer containing an acid group be used in combination with a monomer containing an epoxy group.

Examples of the monomer containing an epoxy group may include, but are not limited to, glycidyl acrylate, glycidyl methacrylate, glycidyl α-ethyl acrylate, glycidyl α-n-propyl acrylate, glycidyl α-n-butyl acrylate, acylic acid-3,4-epoxy butyl, methacrylic acid-3,4-epoxy butyl, acylic acid-6,7-epoxy heptyl, methacrylic acid-6,7-epoxy heptyl, α-ethyl acrylic acid-6,7-epoxy heptyl, o-vinyl benzyl glycidyl ether, m-vinyl benzyl glycidyl ether, and p-vinyl benzyl glycidyl ether.

Further, when a cured resin film is formed using the photosensitive resin composition of the present invention, in order to impart hydrophobicity to the cured resin film, the alkali-soluble acrylic binder resin may include fluorine. For this reason, at the time of preparing the alkali-soluble acrylic binder resin, a monomer containing an acid group may be used in combination with a fluorine-containing monomer.

In this case, the fluorine-containing monomer which can be used in the present invention is not particularly limited as long as it can be copolymerized with other monomers and has one carbon double bond. For example, the fluorine-containing monomer may be a monomer represented by $CH_2=CHC(O)OCHCH_2(CF_2)_xCF_3$ (here, x is an integer of 1~12).

The amount of the fluorine-containing monomer can be adjusted by changing the content of fluorine in the fluorine-containing monomer. In this case, in order to create the desired contact angle of the cured resin film to water or 2-ethoxyethanol, which will be described later, and not to deteriorate developability, coatability and dispersion stability, it is preferred that the content of fluorine in the alkali-soluble acrylic binder resin be adjusted to 5~50 wt %.

As the content of the alkali-soluble acrylic binder resin containing fluorine increases, hydrophobicity improves, but processibility deteriorates. Therefore, the content of the alkali-soluble acrylic binder resin may be 1~50 wt % based on the total solid content of the composition.

The fluorine-containing alkali-soluble acrylic binder resin obtained in this way is added in small amounts during the following process of preparing a colorant, thus exhibiting hydrophobicity.

If the fluorine-containing alkali-soluble acrylic binder resin is added to the colorant, in terms of the dispersion of pigment or the realization of hydrophobicity, it is preferred that the content of the fluorine-containing alkali-soluble acrylic binder resin in the colorant be 1~30 wt % by solid content.

Meanwhile, when the photosensitive resin composition is prepared using only the alkali-soluble acrylic binder resin, a large amount of a multifunctional monomer must be used to form a light-shielding film having a thickness of 2.2 μm, so that the surface of the light-shielding film is rapidly cured by light, with the result that the light-shielding film wrinkles during thermal curing. For this reason, the photosensitive resin composition according to an embodiment of the present invention includes a cardo-based compound. The cardo-based compound is referred to as an acrylic binder resin containing a fluorine group, and is not structurally limited.

For example, the cardo-based compound may be a compound represented by Formula 1 below.

[Formula 1]

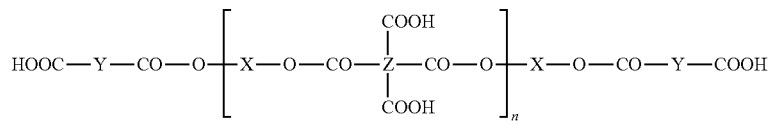

wherein, X is represented by

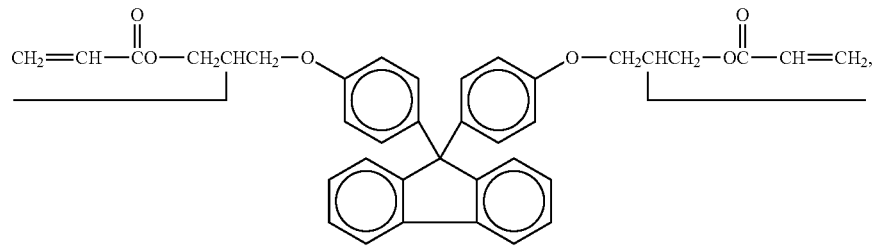

and n is an integer of 1~100.

Further, Y may be a residue of an acid anhydride selected from maleic anhydride, succinic anhydride, cis-1,2,3,6-tetrahydrophthalic anhydride, 3,4,5,6-tetrahydrophthalic anhydride, phthalic anhydride, itaconic anhydride, 1,2,4-benzenetricarboxylic anhydride, methyl-tetrahydrophthalic anhydride, citraconic anhydride, 2,3-dimethylmaleic anhydride, 1-cyclopentene-1,2-dicarboxylic anhydride, cis-5-norbonene-endo-2,3-dicarboxylic anhydride, and 1,8-naphthalic anhydride.

Further, Z may be a residue of an acid dianhydride selected from 1,2,4,5-benzenetetracarboxylic dianhydride, 4,4'-biphthalic dianhydride, 3,3',4,4'-benzophenonetetracarboxylic dianhydride, pyromelitic dianhydride, 1,4,5,8-naphthalenetetracarboxylic dianhydride, 1,2,4,5-tetracarboxylic anhydride, methylnorbonene-2,3-dicarboxylic anhydride, 4,4'-[2,2,2-trifluoro-1-(trifluoromethyl)ethylidene]diphthalic anhydride, 4,4'-oxydiphthalic anhydride, and ethylene glycol bis(anhydro trimelitate).

According to an embodiment of the present invention, a functional group which exhibits hydrophobicity may be introduced into this cardo-based compound. In particular, as described above, a fluorine group may be introduced into the cardo-based compound.

Methods of introducing a fluorine group during the process of preparing the cardo-based compound and examples of compounds which can be used to introduce a fluorine group into the cardo-based compound are not limited. Concretely, such a compound is obtained by Reaction Formula 1 below.

double bond. This multifunctional monomer serves to form a photoresist phase using light. For example, the multifunctional monomer may be selected from the group consisting of propyleneglycol methacrylate, dipentaerythritol hexacrylate, dipentaerythritol acrylate, neopentylglycol diacrylate, 1,6-

[Reaction Formula 1]

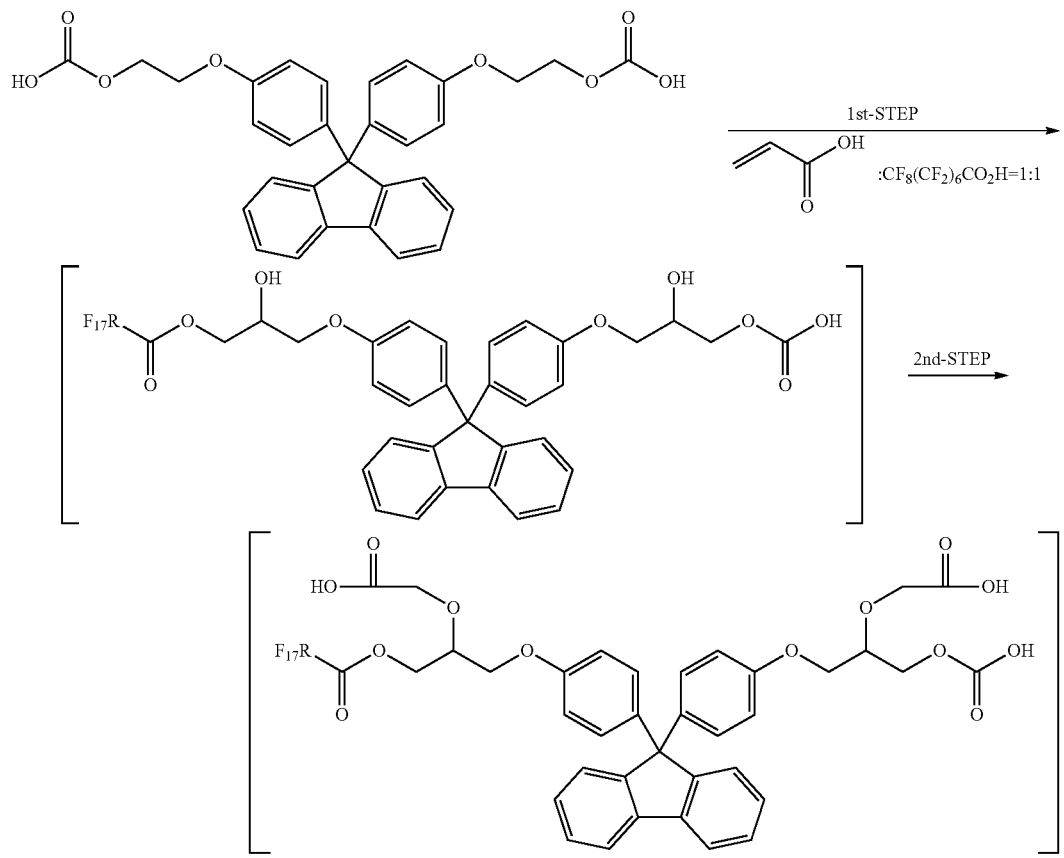

Reaction Formula 1 only illustrates an example of introducing a fluorine group into the cardo-based compound, and does not limit the type of cardo-based compound which can be used in the present invention thereto.

The above cardo-based compound may be included in an amount of 1~50 wt % based on the total solid content of the photosensitive resin composition. In particular, when a cardo-based compound containing a fluorine group is used as the cardo-based compound, when hydrophobicity, developability, coatability and dispersion stability are taken into account, the cardo-based compound containing a fluorine group may be included in an amount of 5~10 wt % based on the total solid content of the photosensitive resin composition.

However, when a cured resin film having a thickness of 2.2 μm is formed using the photosensitive resin composition prepared using only the cardo-based compound, the cardo-based compound reacts with a multifunctional monomer having an ethylenic unsaturated double bond to rapidly cure only the surface of the cured resin film, and thus the cured resin film is wrinkled by the contraction of the inside thereof during thermal curing.

The photosensitive resin composition according to an embodiment of the present invention may further include a multifunctional monomer having an ethylenic unsaturated hexanediol diacrylate, 1,6-hexanediol acrylate, tetraethyleneglycol methacrylate, bisphenoxyethyl alcohol diacryalte, trishydroxyethylisocyanurate trimethacrylate, trimethylpropane trimethacrylate, pentaerythritol trimethacrylate, pentaerythritol tetramethacrylate, dipentaerythritol hexamethacrylate, and mixtures thereof.

The content of the multifunctional monomer may be 0.1~99 parts by weight based on 100 parts by weight of the compound represented by Formula 1 above. In this case, the bonding force between the pigment and particles is increased by the crosslinking attributable to the radical reaction of a photoinitiator using ultraviolet (UV), thus increasing optical density.

The photosensitive resin composition according to an embodiment of the present invention may further include a monomer which can impart hydrophobicity to the photosensitive resin composition. In this case, it is required to select a monomer, which can realize hydrophobicity and does not deteriorate the coatability, adhesivity and leveling effect, as the monomer.

Examples of the monomer may includes a fluorine-containing epoxy compound represented by $CH_2(O)CHCH_2(CF_2)_xCF_3$ (here, x is an integer of 1~12) and a fluorine-containing siloxane compound represented by $CF_3(CF_2)_ySi(OMe)_3$ (here, y is an integer of 1~12).

When this monomer is added to the photosensitive resin composition, the content of this monomer may be changed in consideration of coatability, adhesivity, leveling effect and hydrophobicity. Preferably, the content of this monomer may be 1~12 wt % based on the total solid content of the photosensitive resin composition.

The photosensitive resin composition according to an embodiment of the present invention may further include a photopolymerization initiator. Examples of the photopolymerization initiator may include: oxime ester compounds, such as 1-[9-ethyl-6-(2-methybenzoyl)-9H-carbazol-3-yl]-1-(O-acetyloxime), 1,2-octanedione-1[(4-phenylthio)phenyl]-2-benzoyl-oxime and the like; ketones, such as thioxanthone, 2,4-diethyl thioxanthone, thioxanthone-4-sulfonic acid, benzophenone, 4,4'-bis(diethylamino)benzophenone, acetophenone, p-dimethylaminoacetophenone, dimethoxyacetoxybenzophenone, 2,2'-dimethoxy-2-pentylacetophenone, p-methoxyacetophenone, 2-methyl[4-(methylthio)phenyl]-2-morpholino-1-propanone, 2-benzyl-2-diethylamino-1-(4-morpholinophenyl)-butane-1-one, 2-hydroxy-2-methyl-1-phenylpropane-1-one, 4-(2-hydroxyethoxy)phenyl-(2-hydroxy-2-propyl)ketone, 1-hydroxycyclohexylphenylketone and the like; quinones, such as anthraquinone, 1,4-naphthoquinone and the like; halogen compounds, such as 1,3,5-tris(trischloromethyl)-s-triazine, 1,3-bis(trichloromethyl)-5-(2-chlorophenyl)-s-triazine, 1,3-bis(trichlorophenyl)-s-triazine, phenacyl chloride, tribromomethylphenyl sulfone, tris(trichloromethy)-s-triazine and the like; peroxides, such as di-t-butyl peroxide and the like; and acyl phosphine oxides such as 2,4,6-trimethyl benzoyl diphenyl phosphine oxide and the like.

This photopolymerization initiator may be included in an amount of 1~30 wt % based on the total amount of the photosensitive resin composition.

The photosensitive resin composition according to an embodiment of the present invention may further include a solvent. Examples of the solvent may include propyleneglycolmethyletheracetate (PGMEA), propyleneglycolethyletheracetate, propyleneglycolmethylether, propyleneglycolpropylether, methyl cellosolveacetate, ethylcellosolveacetate, diethylglycolmethylacetate, ethylethoxypropionate, methylethoxypropionate, butylacetate, ethylacetate, cyclohexanone, acetone, methylisobutylketone, dimethylformamide, N,N'-dimthylacetamide, N-methylpyrrolidinone, dipropyleneglycolmethylether, toluene, methylcellosolve, and ethylcellosolve.

The content of the solvent may be 20~60 wt % based on the total amount of the photosensitive resin composition.

In addition, if necessary, the photosensitive resin composition may further include general additives.

The photosensitive resin composition may further include at least one black pigment selected from carbon black, titanium black, acetylene black, aniline black, perylene black, strontium titanate, chromium oxide, ceria. Carbon black may preferably be used as the black pigment. Examples of carbon black may include Black EX-3276 and CF Black EX-3277, manufactured by Mikuni Color Corp. in Japan, and diagram block II, diagram block N339, diagram block SH, diagram block H, diagram block LH, diagram block HA and diagram block SF manufactured by Mitsubishi Chemical Corp. in Japan. Further examples of carbon black may include Regal 250T, Regal 99R and Elftex 12, commercially available from Cabot Corp. in the U.S.A, and Raven 880 Ultra, Raven 860 Ultra, Raven 850 Ultra, Raven 790 Ultra, Raven 760 Ultra, Raven 520Ultra, and Raven 500 Ultra, commercially available from Columbia Chemical Corp. in the U.S.A.

The black pigment may have a particle size of 60~120 nm, preferably, 80~110 nm. In this case, the black pigment is advantageous in that it imparts flowability to the photosensitive resin composition during spin or spinless coating, it prevents surface residues and protrusions from occurring after prebaking, and it improves optical density and adhesivity.

The amount of this black pigment may be 5~60 wt % based on the total amount of the photosensitive resin composition. When the amount of the black pigment is less than 5 wt %, the light-shielding film formed using the photosensitive resin composition cannot sufficiently exhibit a light-blocking effect because its optical density is low. Further, when the amount thereof is more than 60 wt %, since the amount of other components of the photosensitive resin compositions is decreased, it is difficult to cure and develop the composition, and residue occurs.

The photosensitive resin composition according to an embodiment of the present invention may further include a colorant containing a pigment mixture including two or more kinds of pigments which are mixed with each other to exhibit a black color.

Generally, in order to realize a light-blocking effect, the photosensitive resin composition includes black pigment such as carbon black or titanium black. However, when a light-blocking effect is realized using black pigment, the black pigment can act as ionic impurities, and the cured resin film obtained from the photosensitive resin composition including the black pigment has poor compression characteristics.

For this reason, in the photosensitive resin composition according to an embodiment of the present invention, a black color is actually exhibited using a pigment mixture. Here, the term 'actual black color' is referred to as a black color exhibited to such a degree that light is absorbed in all wavelengths of the visible region (380~780 nm).

Preferably, the pigment mixture may be obtained by mixing pigment dispersed liquids, each of which has been formed by dispersing pigment in a solvent, with each other.

Considering light transmittance and dielectric constant, the pigment mixture may prepared by mixing organic pigments. The pigment mixture may essentially include red pigment and blue pigment, and may further include one or more selected from yellow pigment, green pigment and violet pigment.

Examples of the organic pigment are as follows.

Red pigment: color index (C.I.) number 3, 23, 97, 108, 122, 139, 149, 166, 168, 175, 177, 180, 185, 190, 202, 214, 215, 220, 224, 230, 235, 242, 254, 255, 260, 262, 264, 272, yellow pigment: color index (C.I.) number 13, 35, 53, 83, 93, 110, 120, 138, 139, 150, 154, 175, 180, 181, 185, 194, 213, blue pigment: color index (C.I.) number 15, 15:1, 15:3, 15:6, 36, 71, 75, green pigment: color index (C.I.) number 7, 36, and violet pigment: color index (C.I.) number 15, 19, 23, 29, 32, 37.

Further, if necessary, a high-resistance black pigment may be added to the pigment mixture. Examples of the high-resistance black pigment may include, but are not limited to, carbon black, titanium black, and the like.

The pigment mixture may include, based on the total weight of the solid content in the colorant, 10~50 wt % of red pigment, 10~50 wt % of blue pigment, 1~20 wt % of yellow pigment, and 1~20 wt % of green pigment. Here, the pigment mixture may further include 1~20 wt % of violet pigment based on the total weight of the solid content in the colorant. Further, the black pigment may be added to the pigment mixture in an amount of 10 wt % or less based on the total weight of the solid content in the colorant. Since the black pigment has electrical conductivity, the dielectric constant may increase, and the electrical characteristics of a cured resin film may deteriorate. Therefore, when the pigment mixture includes the black pigment, it is preferred that black pigment having high resistance is used as the black pigment. The amount of the high-resistance black pigment that is used may be 15 wt % or less based on the total weight of the solid content in the colorant.

Meanwhile, the optical density and electrical resistance of the light-shielding film formed using the photosensitive resin composition may be changed depending on the degree to which the pigment has been dispersed. For this reason, the colorant may include a pigment dispersant. Examples of the pigment dispersant may include: polymer dispersants, such as modified polyurethane, modified polyacrylate, modified polyester, modified polyamide and the like; and surfactants, such as ester phosphate, polyester, alkylamine and the like. Among the pigment dispersants, acrylic pigment dispersants, such as Disperbyk-2000, Disperbyk-2001, LP-N-21116, LP-N-21208 and the like, manufactured by BYK Chemie Corporation, and EFKA-4300, EFKA-4330, EFKA-4340, EFKA-4400, EFKA-4401, EFKA-4402, EFKA-4046, EFKA-4060 and the like, manufactured by Ciba Corporation, may be more advantageous in terms of realizing dispersion stability, optical density and electrical characteristics.

However, when the amount of pigment dispersant used is excessive, the dispersion stability or the pattern stability is deteriorated by the degeneration of a specific functional group. For this reason, the content of the pigment dispersant may be 3~20 wt % based on the total weight of the colorant, that is, the pigment dispersed liquid.

The total amount of the colorant may be 20~80 wt %, preferably, 30~60 wt %. When the total amount of the colorant is less than 20 wt %, the light-shielding film formed using the photosensitive resin composition cannot sufficiently exhibit a light-blocking effect because its optical density is low. Further, when the amount thereof is more than 80 wt %, since the amount of other components of the photosensitive resin compositions is decreased, it is difficult to cure and develop the composition, and residue formation occurs.

This photosensitive resin composition is prepared by mixing (a) a pigment mixture, (b) an alkali-soluble acrylic binder resin, (c) a cardo-based compound, (d) a multifunctional monomer having an ethylenic unsaturated double bond, (e) a photopolymerization initiator and, if necessary, an organic additive and (f) a solvent using a stirrer and then filtering the mixture using a 5 μm membrane filter.

When a cured resin film is formed using the photosensitive resin composition of the present invention, the cured resin film may have a contact angle of 85° or more to water, and a contact angle of 35° or more to 2-ethoxyethanol.

When the contact angle of the cured resin film to water is less than 85°, during ink-jet printing, a pixel region may overflow with color ink, and the amount of the color ink charged in the pixel region may change.

Further, when the contact angle of the cured resin film to 2-ethoxyethanol is smaller than 85°, during the course of ink-jet printing, a pixel region may also overflow with color ink, and the amount of the color ink charged in the pixel region may also be changed.

Since a light shielding pattern is generally formed on a glass substrate and color ink is charged in the light shield pattern, in terms of the prevention of color mixing or position deviation, the surface tension of the glass substrate must be equal to or larger than the surface tension of the color ink, and the surface tension of the light shielding pattern must be smaller than the surface tension of the color ink.

For this reason, when a cured resin film is formed using the photosensitive resin composition of the present invention, preferably, the cured resin film may have a contact angle of 85°~110° to water, and a contact angle of 35°~50° to 2-ethoxyethanol.

Further, when a cured resin film is formed using the composition, the cured resin film may have a dielectric constant of 10 or more.

The photosensitive resin composition is applied onto a glass substrate having a clean surface or a glass substrate including a transparent electrode layer (for example, a glass substrate deposited with ITO or IZO) using a noncontact applicator such as a spin coater (rotary applicator), a slit coater (non-rotary applicator) or the like.

In the preparation and application of the photosensitive resin composition, in order to improve the adhesivity of the photosensitive resin composition, a silane coupling agent may be added to the photosensitive resin composition or may be applied onto the glass substrate.

After the photosensitive resin composition is applied onto the glass substrate, the photosensitive resin composition is dried at a temperature of 80~120° C., preferably, 80~100° C. for 60~150 seconds using a hot plate, is left at room temperature for several hours~several days or is put into a hot-air heater or an infrared heater to remove a solvent (referred to as prebaking), thus forming a film having a thickness of 1.5~5 μm. Subsequently, the film is irradiated with an active energy ray such as ultraviolet (UV) or the like at a radiation dose of 30~1000 mJ/cm$^2$ using a mask to expose the film. The radiation dose of the active energy ray may be changed depending on the kind of the photosensitive resin composition used to form a light-shielding film. Subsequently, the exposed film is developed using a developer by immersing, spraying or the like to form a cured film pattern. Examples of the developer may include organic developers such as monoethanolamine, diethanolamine, triethanolamine and the like; and a sodium hydroxide aqueous solution, a potassium hydroxide aqueous solution, a sodium carbonate aqueous solution, a quarternary ammonium salt aqueous solution and the like.

Subsequently, the developed film may be post-baked at 150~250° C. for 20~40 minutes.

If the cured resin film formed using the photosensitive resin composition according to an embodiment of the present invention has a fluorine content of 5~50 wt %, it can exhibit a proper light blocking effect and have suitable hydrophobicity.

The cured resin film obtained in this way has a proper light blocking effect and suitable hydrophobicity. In particular, this cured resin film can be usefully used to form a light shielding pattern during the formation of the colored layer using ink-jet printing.

As described above, a liquid crystal display (LCD) exemplifies the displays that can use the colored layer formed using the photosensitive resin composition of the present invention, but the present invention is not limited thereto. Examples of various displays using the colored layer may include plasma display panels (PDPs), organic light emitting display (OLEDs), electroluminescent (EL) displays, cathode ray tubes (CRTs), and the like.

Further, the photosensitive resin composition of the present invention can be applied to various types of liquid crystal displays without limitation. The displays of the present invention can employ various display modes, such as ECB (electrically controlled birefringence), TN (twisted nematic), IPS (in-plane switching), FLC (ferroelectric liquid crystal), OCB (optically compensatory bend), STN (supper twisted nematic), VA (vertically aligned), HAN (hybrid aligned nematic), GH (guest host) and the like. Furthermore, displays including a colored layer formed using the photosensitive resin composition of the present invention may also be applied to large-screen displays such as displays for notebooks, television monitors and the like.

Hereinafter, the present invention will be described in more detail with reference to the following Examples. However, the scope of the present invention is not limited thereto.

Preparation Examples 1 to 5

Synthesis of Alkali-Soluble Acrylic Binder Resin

Components, given in Table 1 below, were put into a 1000 mL four-neck flask, and were then stirred for 30 minutes while blowing nitrogen into the flask. Subsequently, the components were slowly heated to 70° C. and then reacted with each other at 70° C. for 6 hours, and then they were heated to 80° C. and then further reacted with each other at 80° C. for 2 hours to synthesize an alkali-soluble acrylic binder resin. In Table 1 below, the unit is g.

Meanwhile, the amount of fluorine in the synthesized alkali-soluble acrylic binder resin was calculated using an elemental analyzer (model name: Flash EA1112, manufactured by Thermo Fisher Scientific Corp.), and the results thereof are given in Table 1 below.

TABLE 1

|  | Prep. Exp. 1 | Prep. Exp. 2 | Prep. Exp. 3 | Prep. Exp. 4 | Prep. Exp. 5 |
|---|---|---|---|---|---|
| MAA | 39.27 | 28.62 | 26.22 | 24.19 | 22.43 |
| GMA | 130.90 | 121.10 | 110.92 | 102.33 | 49.35 |
| Sty | 26.18 | 15.41 | 14.12 | 13.02 | 11.21 |
| KBM 503 | 21.82 | 8.81 | 8.07 | 7.44 | 6.73 |
| FA-108 | — | 44.04 | 60.50 | 74.42 | 134.58 |
| Initiator | 21.82 | 22.02 | 20.17 | 18.60 | 15.70 |
| PGMEA | 560.000 | 560.00 | 560.00 | 560.00 | 560.00 |
| Fluorine content (wt %) | 0 | 7.8 | 10.0 | 11.8 | 20.0 |

(note)
MAA: methacrylic acid
GMA: glycidyl methacrylate
Sty: styrene
KBM503: 3-(methacryloxypropyl)trimethoxysilane, manufactured by Shin-Etsu Chemical Co., Ltd.
FA-108: 2-(perfluorooctyl)ethyl acrylate, manufacture by Kyoeisha Corp.
Initiator: azobisisobutyronitrille
PGMEA: propyleneglycolmonomethylacetate Preparation Example 6

Synthesis of Cardo-Based Compound 58 g (epoxy equivalent 232) of a bisphenol fluorine type epoxy resin, 313 g of propyleneglycol monomethyl ether acetate, 2.5 g of triethylbenzylammonium chloride, 0.03 g of hydroquinone and 18 g of acrylic acid were put into a 50 mL four-neck flask, and then the mixture was heated to 80~90° C. while blowing nitrogen at a rate of 25 mL/min to melt the mixture. The mixture was slowly heated to a state of white turbidity and was then completely melted at 80° C. The melted mixture was continuously heated and stirred until the acid value thereof was less than 1.0 mgKOH/g. It took the acid value thereof 12 hours to reach a target value. Subsequently, the melted mixture was cooled to room temperature to obtain bisphenol fluorine type epoxy acrylate.

300 g of the obtained bisphenol fluorine type epoxy acrylate was mixed with 14 g of 1,2,3,6-tetrahydrophthalic anhydride, 0.3 g of 3,3',4,4'-biphenyltetracarbonic dianhydride and 0.76 g of tetraethylammonium bromide, heated to 130~140° C. and then reacted with each other at 130~140° C. for 15 hours to obtain a cardo-based compound.

Examples 1 to 20

130 parts by weight of a pigment dispersed liquid (KLBK-90, manufactured by Mikuni Corportion, 20 wt % of solid content) including 5 wt % of a pigment dispersant (disperbyk-2001, manufactured by BYK Corp.) based on the total weight of the pigment dispersed liquid, 2 parts by weight of a multifunctional monomer (dipentaerythritol hexacrylate), 5.2 parts by weight of a photopolymerization initiator, 90 parts by weight of a solvent (propyleneglycol methyl ether acetate (PGMEA)) and 1 part by weight of other additives (a fluorine-containing surfactant and a coupling agent) were mixed with 100 parts by weight of the cardo-based compound obtained in Preparation Example 6 and each of the alkali-soluble acrylic binder resins obtained in Preparation Examples 1 to 5 (refer to Table 2 below), and then the mixture was stirred for 3 hours to prepare a photosensitive resin composition.

However, as shown in Table 2 below, the content ratio of the acrylic binder resin and the cardo-based compound was changed.

TABLE 2

| | | Binder resin | |
|---|---|---|---|
| Examples | Preparation Examples | Content of acrylic binder resin based on 100 parts by weight of cardo-based compound | Content of fluorine in photosensitive resin composition (wt % based on solid content) |
| 1 | Prep. Exp. 1 | 5 | 0 |
| 2 | | 10 | 0 |
| 3 | | 15 | 0 |
| 4 | | 20 | 0 |
| 5 | Prep. Exp. 2 | 5 | 0.5 |
| 6 | | 10 | 0.5 |
| 1 | | 15 | 0.5 |
| 8 | | 20 | 0.5 |
| 9 | Prep. Exp. 3 | 5 | 1.0 |
| 10 | | 10 | 1.0 |
| 11 | | 15 | 1.0 |
| 12 | | 20 | 1.0 |
| 13 | Prep. Exp. 4 | 5 | 1.5 |
| 14 | | 10 | 1.5 |
| 15 | | 15 | 1.5 |
| 16 | | 20 | 1.5 |
| 17 | Prep. Exp. 5 | 5 | 2.0 |
| 18 | | 10 | 2.0 |
| 19 | | 15 | 2.0 |
| 20 | | 20 | 2.0 |

A cured resin film pattern was formed using the photosensitive resin composition obtained in this way as follows. The photosensitive resin composition was applied onto a glass substrate having a clean surface at a spinning rate of 320 rpm using a spin coater to form a resin coating layer. Subsequently, the resin coating layer was dried at a temperature of 80° C. for 150 seconds using a hot plate to have a thickness of 2.2 μm. Subsequently, the resin coating layer was irradiated with an active energy ray such as ultraviolet (UV) or the like at a radiation dose of 60 mJ/cm$^2$ using a mask (gap: 200 μm) to expose the resin coating layer. Subsequently, the exposed resin coating layer was developed using a developer (0.04% KOH, 23° C.) for 100 seconds to form a cured resin film pattern.

Thereafter, the cured resin film pattern was post-baked at 220° C. for 30 minutes to form a cured resin film.

Method of Measuring Optical Density of Cured Resin Film Formed Using Photosensitive Resin Composition The optical density of the obtained cured resin film was measured on the basis of a reference having an optical density of 2.4 using a PMT manufactured by Otsuka Electronics Co., Ltd., and the results are shown in Table 3 below.

Method of Measuring Contact Angle of Cured Resin Film Formed Using Photosensitive Resin Composition The contact angle of the cured resin film to water (deionized water) was measured by dropping 5 μl of water (deionized water) onto the obtained cured resin film using a syringe.

Further, the contact angle of the cured resin film to 2-ethoxyethanol was measured using 2-ethoxyethanol (99%, manufactured by Aldrich Corp.) instead of water.

A contact angle meter (model name: E-EM03-T13-01, manufactured by Kruss Corp.) was used to measure the contact angle of the cured resin film.

Measuring of Pattern Profile

The taper angle of the obtained cured resin film pattern was measured using a scanning electron microscope (SEM).

cated by putting the face of a glass substrate (1 cm×1 cm) including an ITO electrode layer for applying a voltage up against the face of a glass substrate (1 cm×1 cm) including an ITO common electrode layer so that a cell gap of 5 μm was formed.

Meanwhile, 0.02 g of a cured resin film sample obtained by scraping the cured resin film and 1 g of liquid crystal (MLC-7022-100, manufactured by Merck Corp.) were mixed in a test tube, and then the mixture was aged at 65° C. for 5 hours to provide a pollution source.

The provided pollution source was charged in the cell for measuring a voltage holding ratio, and then voltage was applied to the cell under the following conditions to measure a voltage holding ratio (VHR):

applied voltage pulse amplitude: 5V applied voltage pulse frequency: 60 Hz applied voltage pulse width 16.6 msec The voltage holding ratio was measured at 25° C. using Model 6245C manufactured by Toyo Corporation.

The results obtained by the above measuring methods are given in Table 3 below.

TABLE 3

| Examples | Contact angle (°) water | Contact angle (°) 2-ethoxy ethanol | Taper angle (°) | Residue occurrence | Dielectric constant | Optical density (/2.0 μm) | Resolution (μm) | VHR (%) |
|---|---|---|---|---|---|---|---|---|
| 1 | 82.7 | 27.3 | 60 | No | 3.9 | 2.2 | 8 | 97 |
| 2 | | | 60 | No | 3.9 | 2.2 | 8 | 97 |
| 3 | | | 60 | No | 3.9 | 2.2 | 8 | 97 |
| 4 | | | 60 | No | 3.9 | 2.2 | 8 | 97 |
| 5 | 96.4 | 44.1 | 60 | No | 3.9 | 2.2 | 8 | 97 |
| 6 | 100.5 | 45.9 | 60 | No | 3.9 | 2.2 | 8 | 97 |
| 7 | 100.9 | 46.1 | 60 | No | 3.9 | 2.2 | 8 | 97 |
| 8 | 100.7 | 46.3 | 60 | No | 3.9 | 2.2 | 10 | 97 |
| 9 | 99.6 | 47.1 | 60 | Yes | 3.9 | 2.2 | 8 | 97 |
| 10 | 103.6 | 48.2 | 60 | No | 3.9 | 2.2 | 8 | 97 |
| 11 | 103.9 | 48.5 | 60 | No | 3.9 | 2.2 | 9 | 97 |
| 12 | 104.2 | 48.8 | 60 | Yes | 3.9 | 2.2 | 10 | 97 |
| 13 | 103.6 | 48.5 | 60 | No | 3.9 | 2.2 | 8 | 97 |
| 14 | 104.6 | 49.1 | 60 | No | 3.9 | 2.2 | 8 | 97 |
| 15 | 104.9 | 50.2 | 60 | Yes | 3.9 | 2.2 | 10 | 97 |
| 16 | 105.0 | 50.3 | 60 | Yes | 3.9 | 2.2 | 11 | 97 |
| 17 | 104.6 | 49.5 | 60 | No | 3.9 | 2.2 | 8 | 97 |
| 18 | 106.5 | 51.5 | 60 | No | 3.9 | 2.2 | 8 | 97 |
| 19 | 106.9 | 51.8 | 60 | Yes | 3.9 | 2.2 | 10 | 97 |
| 20 | 107.0 | 52.0 | 60 | Yes | 3.9 | 2.2 | 12 | 97 |

Residue

The presence or absence of residue after development was confirmed using a scanning electron microscope (SEM).

Dielectric Constant

A curing solution was applied onto chromium (Cr) glass, was entirely exposed and was then post-baked to obtain a cured resin film, and then the electric constant of the cured resin film was measured at each frequency (100~1 MHz).

The electric constant of the cured resin film was measured using a thermal evaporator (Model name: E306, Edward).

Resolution

A cured resin pattern was developed according to the size of a mask, and the size (width) of the developed cured resin pattern was measured by omnidirectional (OM) image.

Method of Measuring Voltage Holding Ratio of Cured Resin Film Formed Using Photosensitive Resin Composition A cell (manufactured by EHC Corp.) for measuring a voltage holding ratio (VHR) was provided. The cell was fabri- From Table 3 above, it can be seen that the contact angle of each of the cured resin films obtained in Examples 5 to 20 to water is 95° or more and that the contact angle thereof to 2-ethoxyethanol is 35° or more, whereas the contact angle of each of the cured resin films obtained in Examples 1 to 4 to water is 82.7° and the contact angle thereof to 2-ethoxyethanol is 27.3°.

From the above results, it can be inferred that, when a light-shield film is formed and then color ink is charged in the light-shielding film by ink-jet printing, the cured resin films obtained in Examples 5 to 20 do not bring about the problem of the light-shielding film overflowing with color ink to cause color mixing or the color ink deviating from its position in the region defined by the light-shielding film.

From the above results, it can be seen that, in terms of preventing or minimizing the damage to the other values that were evaluated, the optimal Examples are Examples 6, 7, 10, 11, 13, 14, 17 and 18.

Preparation Examples 7 to 10

Synthesis of Alkali-Soluble Acrylic Binder Resin

Components, given in Table 4 below, were put into a 1000 mL four-neck flask, and were then stirred for 30 minutes while blowing nitrogen into the flask. Subsequently, the components were slowly heated to 70° C. and then reacted with each other at 70° C. for 6 hours. They were then heated to 80° C. and then further reacted with each other at 80° C. for 2 hours to synthesize an alkali-soluble acrylic binder resin. In Table 4 below, the unit is g.

Meanwhile, the amount of fluorine in the synthesized alkali-soluble acrylic binder resin was calculated using an elemental analyzer (model name: Flash EA1112, manufactured by Thermo Fisher Scientific Corp.), and the results thereof are given in Table 4 below.

TABLE 4

|  | Prep. Exp. 1 | Prep. Exp. 7 | Prep. Exp. 8 | Prep. Exp. 9 | Prep. Exp. 10 |
|---|---|---|---|---|---|
| MAA | 39.27 | 28.62 | 26.22 | 24.19 | 22.43 |
| GMA | 130.90 | 121.10 | 110.92 | 102.33 | 49.35 |
| Sty | 26.18 | 15.41 | 14.12 | 13.02 | 11.21 |
| KBM 503 | 21.82 | 8.81 | 8.07 | 7.44 | 6.73 |
| HF-19 | — | 44.04 | 60.50 | 74.42 | 134.58 |
| Initiator | 21.82 | 22.02 | 20.17 | 18.60 | 15.70 |
| PGMEA | 560.000 | 560.00 | 560.00 | 560.00 | 560.00 |
| Fluorine content (wt %) | 0 | 9.4 | 12.0 | 14.2 | 24 |

(note)
MAA: methacrylic acid
GMA: glycidyl methacrylate
Sty: styrene
KBM503: 3-(methacryloxypropyl)trimethoxysilane, manufactured by Shin-Etsu Chemical Co., Ltd.
HF-19 (Heneicosafluorododecyl acrylate): C(O)OCHCH2(CF2)xCF3 (here, x is 9), manufactured by Aldrich Corporation
Initiator: azobisisobutyronitrille
PGMEA: propyleneglycolmonomethylacetate Examples 21 to 40

130 parts by weight of a pigment dispersed liquid (KLBK-90, manufactured by Mikuni Corporation, 20 wt % of solid content) including 5 wt % of a pigment dispersant (disperbyk-2001, manufactured by BYK Corp.) based on the total weight of the pigment dispersed liquid, 2 parts by weight of a multifunctional monomer (dipentaerythritol hexacrylate), 5.2 parts by weight of a photopolymerization initiator, 90 parts by weight of a solvent (propyleneglycol methyl ether acetate (PGMEA)) and 1 part by weight of other additives (a fluorine-containing surfactant and a coupling agent) were mixed with 100 parts by weight of the cardo-based compound obtained in Preparation Example 6 and each of the alkali-soluble acrylic binder resins obtained in Preparation Examples 7 to 10 (refer to Table 5 below), and then the mixture was stirred for 3 hours to prepare a photosensitive resin composition.

Here, the parts by weight of each component are based on 100 parts by weight of the cardo-based compound in terms of the solid content of the cardo-based compound.

However, as shown in Table 5 below, the content ratio of the acrylic binder resin and the cardo-based compound was changed.

TABLE 5

| | | Binder resin | |
|---|---|---|---|
| Examples | Preparation Examples | Content of acrylic binder resin based on 100 parts by weight of cardo-based compound | Content of fluorine in photosensitive resin composition (wt % based on solid content) |
| 21 | Prep. Exp. 1 | 5 | 0 |
| 22 | | 10 | 0 |
| 23 | | 15 | 0 |
| 24 | | 20 | 0 |
| 25 | Prep. Exp. 7 | 5 | 0.6 |
| 26 | | 10 | 0.6 |
| 27 | | 15 | 0.6 |
| 28 | | 20 | 0.6 |
| 29 | Prep. Exp. 8 | 5 | 1.2 |
| 30 | | 10 | 1.2 |
| 31 | | 15 | 1.2 |
| 32 | | 20 | 1.2 |
| 33 | Prep. Exp. 9 | 5 | 1.8 |
| 34 | | 10 | 1.8 |
| 35 | | 15 | 1.8 |
| 36 | | 20 | 1.8 |
| 37 | Prep. Exp. 10 | 5 | 2.4 |
| 38 | | 10 | 2.4 |
| 39 | | 15 | 2.4 |
| 40 | | 20 | 2.4 |

A cured resin film pattern was formed using the photosensitive resin composition obtained in this way in the same manner as in Examples 1 to 20, and the optical density, contact angle, pattern profile, residue occurrence, dielectric constant and voltage holding ratio of the cured resin film were measured in the same manner, and results thereof are given in Table 6 below.

TABLE 6

| | Contact angle (°) | | | | | | | |
|---|---|---|---|---|---|---|---|---|
| Examples | water | 2-ethoxy ethanol | Taper angle (°) | Residue occurrence | Dielectric constant | Optical density (/2.0 μm) | Resolution (μm) | VHR (%) |
| 21 | 82.7 | 27.3 | 60 | No | 4.1 | 2.2 | 8 | 97 |
| 22 | | | 60 | No | 4.1 | 2.2 | 8 | 97 |
| 23 | | | 60 | No | 4.1 | 2.2 | 8 | 97 |
| 24 | | | 60 | No | 4.1 | 2.2 | 8 | 97 |
| 25 | 96.7 | 44.4 | 60 | No | 4.1 | 2.2 | 8 | 97 |
| 26 | 100.8 | 46.2 | 60 | No | 4.1 | 2.2 | 8 | 97 |
| 27 | 101.3 | 46.7 | 60 | No | 4.1 | 2.2 | 8 | 97 |
| 28 | 101.5 | 47.0 | 60 | No | 4.1 | 2.2 | 8 | 97 |
| 29 | 103.9 | 47.5 | 60 | No | 4.1 | 2.2 | 8 | 97 |

TABLE 6-continued

| Examples | Contact angle (°) water | Contact angle (°) 2-ethoxy ethanol | Taper angle (°) | Residue occurrence | Dielectric constant | Optical density (/2.0 μm) | Resolution (μm) | VHR (%) |
|---|---|---|---|---|---|---|---|---|
| 30 | 104.1 | 48.4 | 60 | No | 4.1 | 2.2 | 8 | 97 |
| 31 | 104.1 | 47.6 | 60 | Yes | 4.1 | 2.2 | 9 | 97 |
| 32 | 103.6 | 48.1 | 60 | Yes | 4.1 | 2.2 | 9 | 97 |
| 33 | 103.6 | 48.1 | 60 | No | 4.1 | 2.2 | 8 | 97 |
| 34 | 105.1 | 50.5 | 60 | No | 4.1 | 2.2 | 8 | 97 |
| 35 | 105.7 | 50.7 | 60 | Yes | 4.1 | 2.2 | 9 | 97 |
| 36 | 105.1 | 51.3 | 60 | Yes | 4.1 | 2.2 | 10 | 97 |
| 37 | 105.1 | 50.9 | 60 | No | 4.1 | 2.2 | 8 | 97 |
| 38 | 106.1 | 51.2 | 60 | Yes | 4.1 | 2.2 | 10 | 97 |
| 39 | 107.8 | 53.3 | 60 | Yes | 4.1 | 2.2 | 10 | 97 |
| 40 | 110.5 | 54.0 | 60 | Yes | 4.1 | 2.2 | 10 | 97 |

From Table 6 above, it can be seen that the contact angle of each of the cured resin films obtained in Examples 25 to 40 to water is 95° or more and the contact angle thereof to 2-ethoxyethanol is 35° or more, whereas the contact angle of each of the cured resin films obtained in Examples 21 to 24 to water is 82.7° and the contact angle thereof to 2-ethoxyethanol is 27.3°.

From the above results, it can be guessed that, when a light-shield film is formed and then color ink is charged in the light-shielding film by ink-jet printing, the cured resin films obtained in Examples 25 to 40 do not bring about the problem of the light-shielding film overflowing with color ink to cause color mixing or the color ink deviating from the position in the region defined by the light-shielding film.

From the above results, it can be seen that, in terms of preventing or minimizing the damage to the other values that were evaluated, the optimal Examples are Examples 26, 27, 28, 29, 30, 33, 34 and 37.

As described above, when a cured resin film is formed using the photosensitive resin composition of the present invention, the cured resin film exhibits proper optical density and hydrophobicity. Therefore, in the case where a light-shielding pattern is formed using the photosensitive resin composition of the present invention, when color ink is charged in the region defined by the light-shielding pattern by ink-jet printing, the problem of the light-shielding pattern overflowing with color ink to result in color mixing or the color ink deviating from its position in the region defined by the light-shielding pattern can be solved. For this reason, according to the photosensitive resin composition of the present invention, a colored layer can be easily formed, and thus display defects can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A photosensitive resin composition, comprising:
an alkali-soluble acrylic binder resin; and
a cardo-based binder resin,
wherein the cardo-based binder resin includes a fluorine functional group;
wherein when a cured resin film is formed using the composition, the cured resin film has an optical density (OD) of 2.0 or more per unit thickness (2.0 μm), a contact angle of 85°-110° to water, and a contact angle of 35°-50° to 2-ethoxyethanol; and
wherein the alkali-soluble acrylic binder resin is a polymer of a composition including a monomer represented by $C(O)OCHCH_2(CF_2)_xCF_3$ (here, x is an integer of 1-12), and includes 5-50 wt % of fluorine.

2. The photosensitive resin composition according to claim 1, further comprising at least one black pigment selected from the group consisting of carbon black, titanium black, acetylene black, aniline black, perylene black, strontium titanate, chromium oxide, ceria.

3. The photosensitive resin composition according to claim 2, wherein the black pigment is included in an amount of 5-60 wt % in a solid content.

4. The photosensitive resin composition according to claim 1, further comprising a colorant containing a pigment mixture including two or more kinds of pigments which are mixed with each other to exhibit a black color.

5. The photosensitive resin composition according to claim 4, wherein the pigment mixture includes essential red and blue pigments and one or more selected from yellow pigment, green pigment and violet pigment.

6. The photosensitive resin composition according to claim 5, wherein the pigment mixture includes, based on a total weight of a solid content of the colorant, 10-50 wt % of red pigment, 10-50 wt % of blue pigment, 1-20 wt % of yellow pigment, and 1-20 wt % of green pigment.

7. The photosensitive resin composition according to claim 6, wherein the pigment mixture further includes, based on a total weight a solid content of the colorant, 1-20 wt % of violet pigment.

8. The photosensitive resin composition according to claim 4, wherein the colorant is included in an amount of 20-80 wt % based on the total weight of the composition.

9. The photosensitive resin composition according to claim 4, wherein the pigment mixture is a pigment dispersed liquid in which each pigment is dispersed in a solvent.

10. The photosensitive resin composition according to claim 9, wherein the pigment dispersed liquid includes a fluorine-containing acrylic binder resin.

11. The photosensitive resin composition according to claim 1, further comprising a fluorine-containing epoxy monomer.

12. The photosensitive resin composition according to claim 1, further comprising a fluorine-containing siloxane monomer.

13. The photosensitive resin composition according to claim 1, wherein, when a cured resin film is formed using the composition, the cured resin film has a fluorine content of 5-50 wt %.

14. The photosensitive resin composition according to claim 1, wherein, when a cured resin film is formed using the composition, the cured resin film has a dielectric constant of 10 or more.

15. A substrate for displays, comprising a black matrix formed using the photosensitive resin composition of claim 1.

16. An image display device, comprising the substrate for displays of claim 15.

* * * * *